(12) United States Patent
Hawley et al.

(10) Patent No.: US 6,767,769 B2
(45) Date of Patent: Jul. 27, 2004

(54) METAL-TO-METAL ANTIFUSE EMPLOYING CARBON-CONTAINING ANTIFUSE MATERIAL

(75) Inventors: Frank Hawley, Campbell, CA (US); John McCollum, Saratoga, CA (US); Jeewika Ranaweera, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/405,860

(22) Filed: Apr. 1, 2003

(65) Prior Publication Data

US 2003/0205723 A1 Nov. 6, 2003

Related U.S. Application Data

(62) Division of application No. 09/972,825, filed on Oct. 2, 2001.

(51) Int. Cl.$^7$ .............................................. H01L 21/82
(52) U.S. Cl. ........................................ 438/131; 257/76
(58) Field of Search ........................................ 438/131

(56) References Cited

U.S. PATENT DOCUMENTS

| | | | |
|---|---|---|---|
| 4,442,507 A | | 4/1984 | Roesner ...................... 365/100 |
| 4,899,205 A | * | 2/1990 | Hamdy et al. ................. 357/51 |
| 5,070,384 A | * | 12/1991 | McCollum et al. ............ 357/51 |
| 5,171,715 A | * | 12/1992 | Husher et al. ............... 438/131 |
| 5,181,096 A | | 1/1993 | Forouhi ....................... 257/530 |
| 5,308,795 A | * | 5/1994 | Hawley et al. .............. 438/131 |
| 5,365,104 A | | 11/1994 | Godinho et al. ............. 257/529 |
| 5,411,917 A | | 5/1995 | Forouhi et al. .............. 437/195 |
| 5,576,576 A | | 11/1996 | Hawley et al. .............. 257/530 |
| 5,592,016 A | | 1/1997 | Go et al. ...................... 257/530 |
| 5,763,898 A | | 6/1998 | Forouhi et al. ................ 257/50 |
| 5,780,323 A | * | 7/1998 | Forouhi et al. .............. 438/131 |
| 5,789,764 A | * | 8/1998 | McCollum ..................... 257/76 |
| 6,114,714 A | | 9/2000 | Gangopadhyay ............. 257/50 |
| 6,437,365 B1 | | 8/2002 | Hawley et al. ................ 257/50 |
| 2002/0100907 A1 | | 8/2002 | Wang .......................... 257/50 |

FOREIGN PATENT DOCUMENTS

| | | | |
|---|---|---|---|
| EP | 0 250 078 A2 | 12/1987 | ........... H01L/23/52 |
| EP | 0 671 767 A2 A3 | 9/1995 | ......... H01L/23/525 |
| JP | 60-242678 | 12/1985 | ........... H01L/29/78 |
| JP | 06-295991 | 10/1994 | ........... H01L/27/10 |
| WO | WO 92/21154 | 11/1992 | ........... H01L/45/00 |

OTHER PUBLICATIONS

S. Liu, et al., "A New Metal-to-Metal Antifuse with Amorphous Carbon", *IEEE Electron Device Letters*, vol. 19, No. 9, pp. 317–319 (Sep. 1998).

* cited by examiner

Primary Examiner—David Nelms
Assistant Examiner—Thao P. Le
(74) Attorney, Agent, or Firm—Sierra Patent Group, Ltd.

(57) ABSTRACT

A method of fabricating a metal-to-metal antifuse, comprising planarizing an insulating layer and a tungsten plug, forming an antifuse material layer over the insulating layer and the tungsten plug, defining the antifuse material layer, forming a barrier metal layer over the antifuse material layer, defining the barrier metal layer, forming an oxide or tungsten layer over the barrier metal layer, forming a layer of photoresist over the oxide or the tungsten layer, defining the oxide or the tungsten layer, removing the photoresist, forming a first masking layer over the barrier metal layer, defining a shape of the antifuse, removing the first masking layer, forming a metal interconnect layer over the insulating layer, forming a second masking layer over the metal interconnect layer, and removing the second masking layer.

17 Claims, 8 Drawing Sheets

METAL-TO-METAL ANTIFUSE EMPLOYING CARBON-CONTAINING ANTIFUSE MATERIAL

CROSS-REFERENCE TO RELATED APPLICATION

This application is a divisional of co-pending U.S. patent application Ser. No. 09/972,825, filed Oct. 2, 2001.

BACKGROUND

The present application relates to antifuses, and more particularly, to metal-to-metal antifuses fabricated using carbon-containing antifuse layers.

Metal-to-metal antifuses are well known in the art. These devices are formed above a semiconductor substrate, usually between two metal interconnect layers in an integrated circuit and comprises an antifuse material layer sandwiched between a pair of lower and upper conductive electrodes, each electrode in electrical contact with one of the two metal interconnect layers.

Numerous materials have been proposed for use as antifuse material layers in above-substrate antifuses. Such materials include amorphous silicon or an alloy thereof, poly silicon, crystalline carbon, silicon, germanium, chalcogenide elements.

SUMMARY

A metal-to-metal antifuse is disposed between two metal interconnect layers in an integrated circuit. An insulating layer is disposed above a lower metal interconnect layer. The insulating layer includes a via formed therethrough containing a tungsten plug in electrical contact with the lower metal interconnect layer. The tungsten plug forms a lower electrode of the antifuse. The upper surface of the tungsten plug is planarized with the upper surface of the insulating layer. In a first embodiment, an antifuse layer comprising a material selected from the group including amorphous carbon, amorphous carbon doped with hydrogen or fluorine, and amorphous silicon carbide is disposed above the upper surface of the tungsten plug. An adhesion-promoting layer of a material such as SiN or SiC may be provided at the interfaces of the antifuse layer and the other layers in the structure. A barrier metal layer disposed over the antifuse layer forms an upper electrode of the antifuse. In a second embodiment, a barrier metal layer is also disposed between the top surface of the tungsten plug and the antifuse layer.

BRIEF DESCRIPTION OF THE FIGURES

Referring now to the figures, wherein like elements are numbered alike.

DETAILED DESCRIPTION OF THE INVENTION

Those of ordinary skill in the art will realize that the following description is illustrative only and not in any way limiting. Other embodiments will readily suggest themselves to such skilled persons.

The metal-to-metal antifuses are disposed between two metal interconnect layers that lie above and are insulated from the semiconductor substrate in an integrated circuit. An insulating layer is disposed above a lower metal interconnect layer. The insulating layer includes a via formed therethrough containing a tungsten plug in electrical contact with the lower metal interconnect layer. The tungsten plug forms a lower electrode of the antifuse. The upper surface of the tungsten plug is planarized with the upper surface of the insulating layer.

Figure 1A:
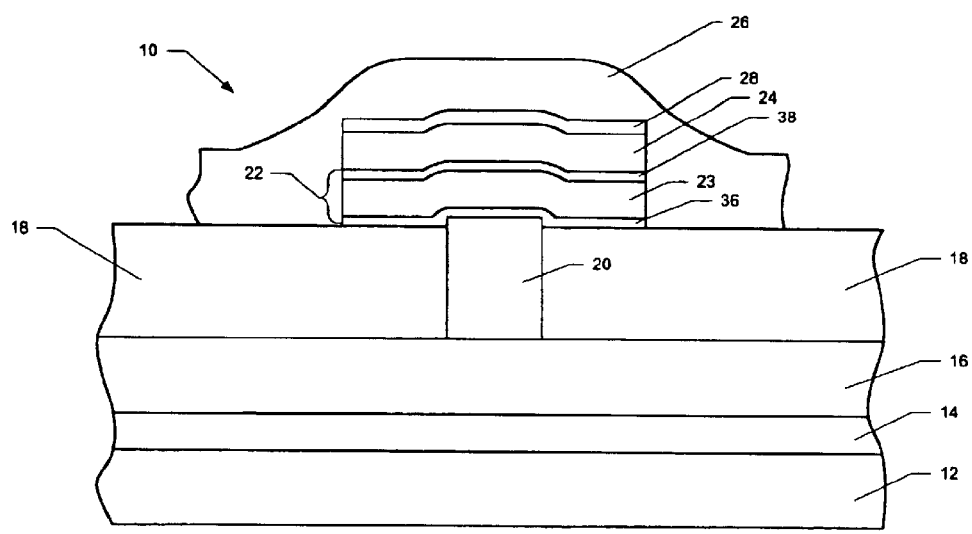
FIG. 1A is a cross-sectional view of an illustrative antifuse.

Referring first to FIG. 1A, a cross-sectional view shows an illustrative metal-to-metal antifuse 10. In the embodiment shown in FIG. 1, substrate 12 is shown covered by insulating layer 14 and metal interconnect layer 16. Persons of ordinary skill in the art will realize that FIG. 1A is merely illustrative and that metal interconnect layer 16 need not be the first metal interconnect layer in a multi-level metal integrated circuit.

Insulating layer 18, comprising, for example, deposited silicon dioxide having a thickness from between about 400 nanometers (nm) to about 1,000 nm, is disposed above metal interconnect layer 16 and includes a tungsten plug 20 formed in a via therethrough and electrically coupled to metal interconnect layer 16. As is known in the art, the upper surfaces of insulating layer 18 and tungsten plug 20 may be planarized to provide a relatively flat surface upon which to fabricate antifuse 10. Alternatively, tungsten plug 20 may be raised above the surface of the insulating layer 18 by performing planarization using CMP techniques or by performing a plasma oxide etch after planarization.

In the embodiment of FIG. 1A, an antifuse layer 22 is disposed over tungsten plug 20. The antifuse layer 22 may have a thickness of about 2.5 nm to about 1,000 nm. The antifuse layer 22 may comprise an antifuse material 23 selected from the group including amorphous carbon, amorphous carbon doped with hydrogen or fluorine, and amorphous silicon carbide and may have a thickness of about 2.5 nm to about 1,000 nm. In addition, combinations of the materials as disclosed herein may be used for the antifuse material 23. The amorphous carbon, and combinations thereof, may be disposed on the device using a source gas, preferably acetylene gas ($C_2H_2$).

For example, the antifuse material 23 may be formed from amorphous carbon, amorphous carbon doped with fluorine or hydrogen, or amorphous silicon carbide having a thickness of between about 10 nm to about 80 nm. Where antifuse material 23 is formed from amorphous carbon doped with hydrogen, the hydrogen doping should be from about 1 atomic percent to about 40 atomic percent. Where antifuse material 23 is formed from amorphous carbon doped with fluorine, the fluorine doping should be from about 0.5 atomic percent to about 20 atomic percent. Where antifuse material 23 is formed from silicon carbide, the percentage of carbon atoms in the composition should be greater than 50%.

Antifuse layer 22 may also be formed from a combination of layers, including adhesion layers 36, 38. A first example is a layer of amorphous silicon carbide having a thickness of about 2.5 nm, a layer of amorphous carbon having a thickness of between about 10 nm and about 80 nm, and a layer of amorphous silicon carbide having a thickness of about 2.5 nm. A second example is a layer of amorphous silicon nitride having a thickness of about 2.5 nm, a layer of amorphous carbon having a thickness of between about 10 nm and about 80 nm, and a layer of amorphous silicon nitride having a thickness of about 2.5 nm.

When the antifuse material 23 comprises amorphous carbon or doped amorphous carbon, a thin (e.g., 2.5 nm) adhesion-promoting layer of SiN or SiC is disposed below the antifuse material 23 and above the antifuse material 23 to promote adhesion between the antifuse material 23 and the adjoining layers in the antifuse structure. For purposes of this disclosure, antifuse material layers comprising amorphous carbon or doped amorphous carbon shall be construed to include such adhesion-promoting layers as a part of their structure.

A first example is a lower adhesion layer 36 of silicon carbide having a thickness of about 2.5 nm, a middle layer 23 of amorphous carbon having a thickness of between about 10 nm and about 80 nm, and an upper adhesion layer 38 of silicon carbide having a thickness of about 2.5 nm. A second example is a lower adhesion layer 36 of silicon nitride having a thickness of about 2.5 nm, a middle layer 23 of amorphous carbon having a thickness of between about 10 nm and about 80 nm, and an upper adhesion layer 38 of silicon nitride having a thickness of about 2.5 nm.

A barrier metal layer 24 such as Ta, TaN, TaC, Ti, TiC, or TiN having a thickness of about 25 nm to about 200 nm is disposed over the antifuse material layer forming an upper electrode of the antifuse. In a second embodiment to be disclosed herein, an additional lower barrier metal layer is disposed between the top surface of the tungsten plug and the antifuse material 23. In the embodiment illustrated in FIG. 1A, a hard mask layer 28 is deposited over the barrier metal layer 24. The hard mask layer 28 may be comprised of, for example, an oxide such as silicon oxide, a metal such as tungsten, or another suitable material known in the art.

Figure 1B:
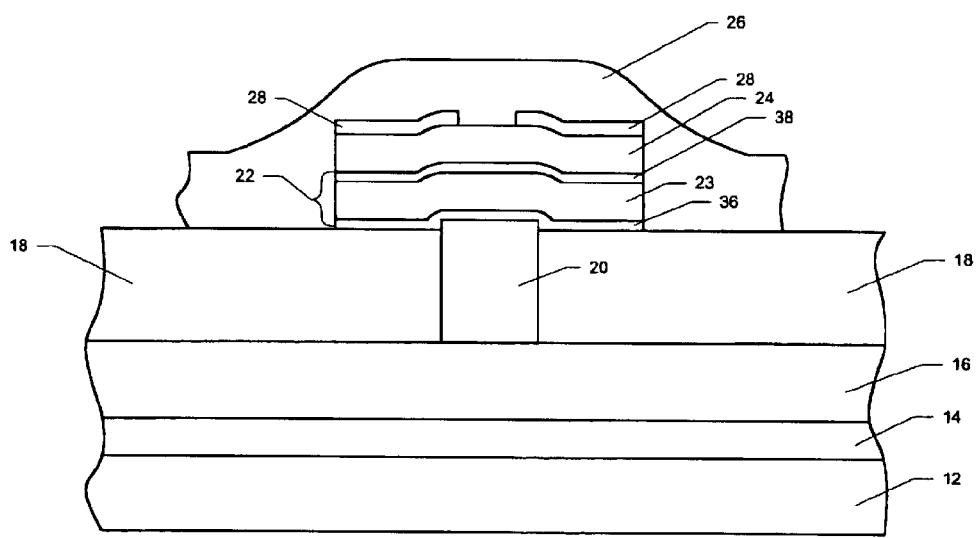
FIG. 1B is a cross-sectional view of another illustrative antifuse.

The embodiment shown in FIG. 1B is similar to the embodiment shown in FIG. 1A, except that the hard mask layer 28 in FIG. 1B is comprised of an insulator such as silicon dioxide, and has been etched to include a via through which electrical contact to a metal layer may be made.

Figure 2A:
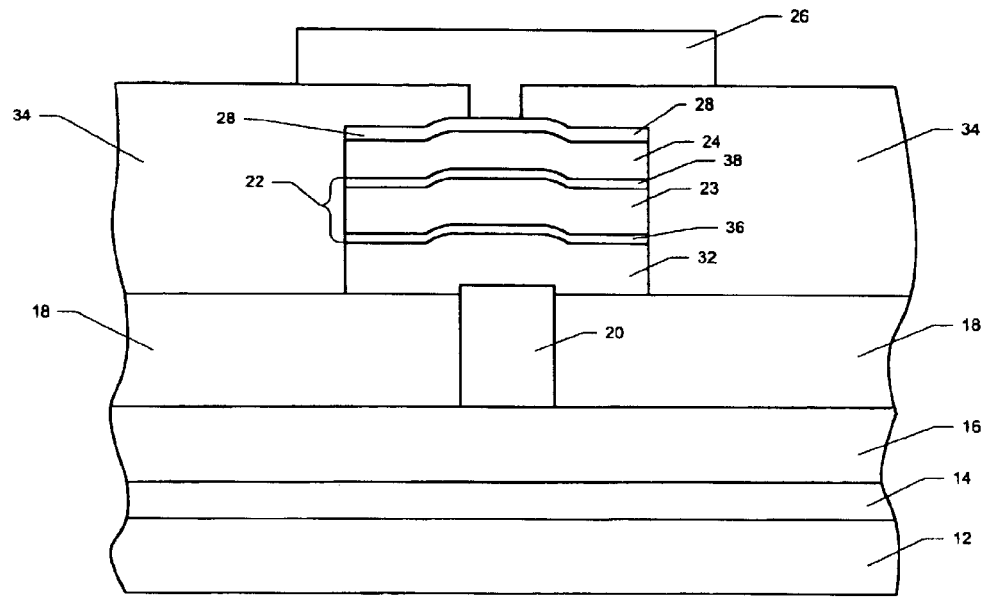
FIG. 2A is a cross-sectional view of another illustrative antifuse.
Figure 2B:
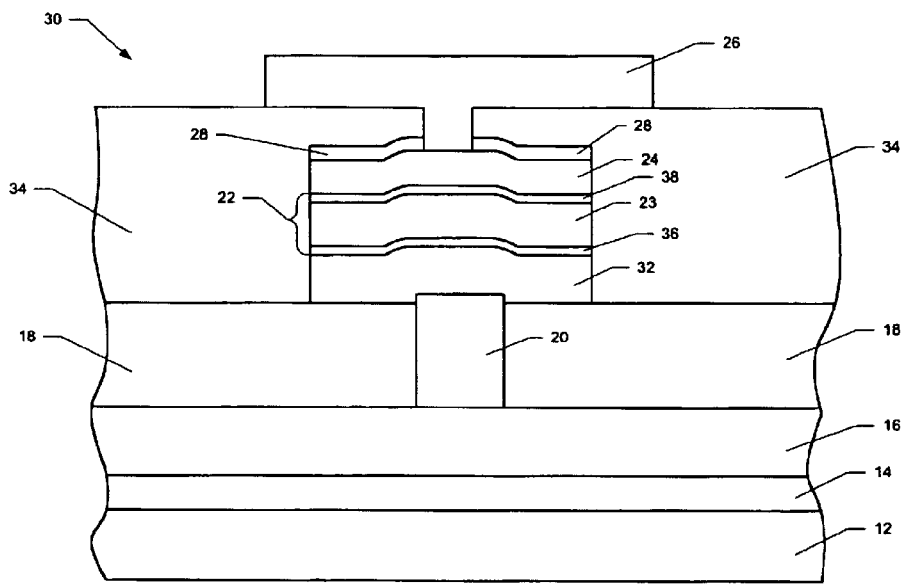
FIG. 2B is a cross-sectional view of another illustrative antifuse.

Referring now to FIG. 2B, a cross-sectional view shows an illustrative metal-to-metal antifuse 30. The embodiment illustrated in FIG. 2B is similar to the embodiments illustrated in FIGS. 1A and 1B, and structures in the embodiment of FIG. 2B corresponding to structures in FIGS. 1A–1B will be identified by the same reference numerals. Also, unless otherwise noted, persons of ordinary skill in the art will appreciate that the materials and thicknesses of the various layers will be similar to those disclosed with respect to the embodiment of FIGS. 1A–B.

In the embodiment shown in FIG. 2B, substrate 12 is shown covered by insulating layer 14 and metal interconnect layer 16. As was the case with the embodiments illustrated in FIGS. 1A–1B, persons of ordinary skill in the art will realize that FIG. 2B is merely illustrative and that metal interconnect layer 16 need not be the first metal interconnect layer in a multi-level metal integrated circuit.

Insulating layer 18, comprising, for example, deposited silicon dioxide, is disposed above metal interconnect layer 16 and includes a tungsten plug 20 formed in a via therethrough and electrically coupled to metal interconnect layer 16. As is known in the art, the upper surfaces of insulating layer 18 and tungsten plug 20 may be planarized to provide a relatively flat surface upon which to fabricate antifuse 30. Alternatively, tungsten plug 20 may be raised above the surface of the insulating layer 18 by performing planarization using CMP techniques or by performing a plasma oxide etch after planarization.

As previously mentioned, the embodiment of the invention of FIG. 2B includes an additional barrier metal layer 32 disposed between the top surface of the tungsten plug and the antifuse layer 22. Antifuse layer 22 is the same as that disclosed with respect to the embodiments of FIGS. 1A–1B.

A barrier metal layer 24 such as Ta, TaN, TaC, Ti, TiC, or TiN having a thickness of about 25 nm to about 200 nm is disposed over the antifuse layer 22 forming an upper electrode of the antifuse 30 of FIG. 2B. In the embodiment illustrated in FIG. 2B, a hard mask layer 28 is shown as an oxide layer deposited over the barrier metal layer 24. During processing, a layer of photoresist is deposited on the oxide layer and then the oxide layer is etched. Following etching, the photoresist is stripped and the remaining oxide layer is left as a hard mask, acting as an etch mask when etching the barrier metal layer 24 and the antifuse layer 22. The hard mask layer 28 protects the antifuse layer 22 from being removed during the photoresist stripping step.

FIG. 2A shows an antifuse device similar to the device shown in FIG. 2B, where a metal layer such as tungsten comprises the hard mask 28. Since Al, Ti, Ta, TaC, TiC, TaN, and TiN have high selectivity to tungsten (W), a thin layer of PVD or CVD tungsten (about 25 nm to about 50 nm) can also be used as a hard mask 28 to etch the underlying metal 24. Since the tungsten layer is thin, only a thin layer of photoresist is required to pattern hard mask 28. Once the hard mask 28 is open, the remaining photoresist is stripped and metal layer 24 can be etched without organic material present on the metal stack. Once the metal layer 24 is etched, the tungsten hard mask can be etched in reactive ion etch (RIE) with an SF6 chemistry. It is also possible to leave the thin tungsten hard mask layer 28 above the etched metal stack, as shown in FIG. 2A. The use of an oxide or tungsten hard mask provides high etch selectivity and the possibility to etch metals without affecting the dielectric constant value (K) and mechanical properties of the amorphous carbon antifuse layer 22.

Another difference between the embodiments of FIGS. 1A–1B and 2A–2B is that an additional insulating layer 34, that may comprise a deposited layer of silicon dioxide having a thickness of about 100 nm to about 200 nm may be employed over the structure including barrier metal layer 32, antifuse layer 22, and barrier metal layer 24, as shown in FIGS. 2A–2B. Metal interconnect layer 26 is disposed over the insulating layer 34 and contacts barrier metal layer 24 through a via formed the insulating layer 34.

Figure 3A:
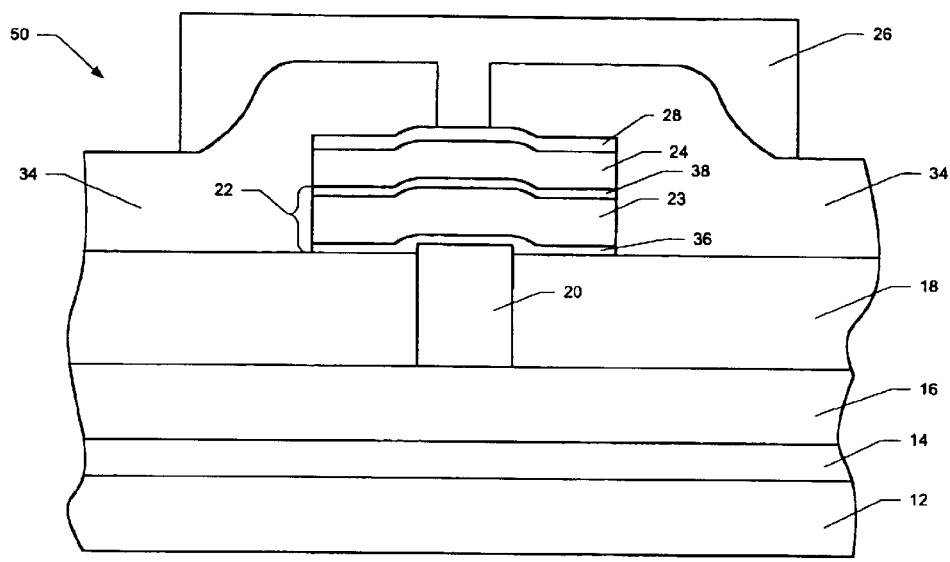
FIG. 3A is a cross-sectional view of another illustrative antifuse.

Referring now to FIG. 3A, a cross-sectional view shows an illustrative metal-to-metal antifuse 50. The embodiment illustrated in FIG. 3A is similar to the embodiment illustrated in FIG. 1A, and structures in the embodiment of FIG. 3A corresponding to structures in FIG. 1A will be identified by the same reference numerals. Also, unless otherwise noted, persons of ordinary skill in the art will appreciate that the materials and thicknesses of the various layers will be similar to those disclosed with respect to the embodiment of FIG. 1A.

In the embodiment shown in FIG. 3A, substrate 12 is shown covered by insulating layer 14 and metal interconnect layer 16. As was the case with the embodiment illustrated in FIG. 1A, persons of ordinary skill in the art will realize that FIG. 3A is merely illustrative and that metal interconnect layer 16 need not be the first metal interconnect layer in a multi-level metal integrated circuit.

Insulating layer 18, comprising, for example, deposited silicon dioxide, is disposed above metal interconnect layer 16 and includes a tungsten plug 20 formed in a via therethrough and electrically coupled to metal interconnect layer 16. As is known in the art, the upper surfaces of insulating layer 18 and tungsten plug 20 may be planarized to provide a relatively flat surface upon which to fabricate antifuse 50. Alternatively, tungsten plug 20 may be raised above the surface of the insulating layer 18 by performing planarization using CMP techniques or by performing a plasma oxide etch after planarization.

As previously mentioned, an antifuse layer 22 is disposed over tungsten plug 20. Antifuse layer 22 is the same as that disclosed with respect to the embodiment of FIG. 1A. A barrier metal layer 24 such as Ta, TaN, TaC, Ti, TiC, or TiN having a thickness of about 25 nm to about 200 nm is disposed over the antifuse material layer forming an upper electrode of the antifuse 50 of FIG. 3A. In the embodiment illustrated in FIG. 3A, an oxide layer 28 is deposited over the barrier metal layer 24.

A difference between the embodiments of FIGS. 1A and 3A is that an additional insulating layer 34, that may comprise a deposited layer of silicon nitride or silicon oxide (using PECVD techniques) having a thickness of about 50 nm to about 200 nm, with about 100 nm preferred, may be employed over the structure including antifuse layer 22 and barrier metal layer 24, as shown in FIG. 3A. This material protects antifuse layer 22 from shorting with the metal interconnect layer 26. Metal interconnect layer 26 is disposed over the insulating layer 34 and contacts the antifuse stack through a via formed through insulating layer 34.

Figure 3B:
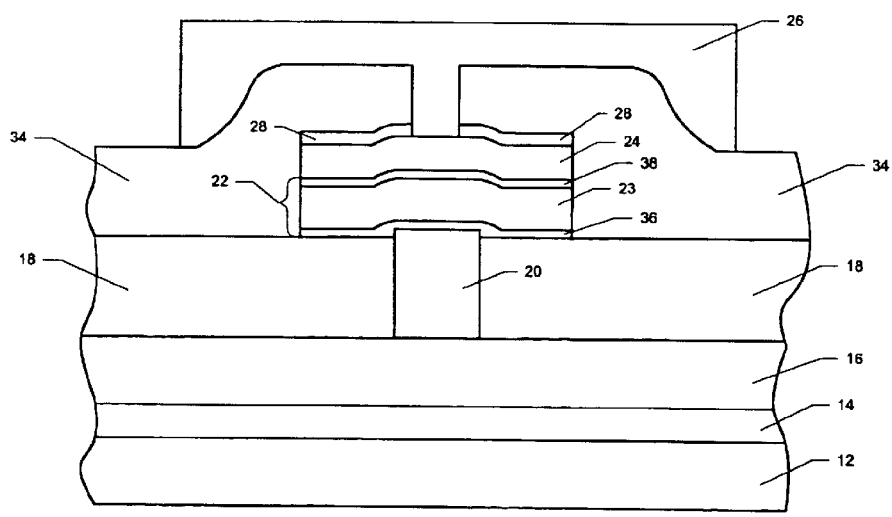
FIG. 3B is a cross-sectional view of another illustrative antifuse.

In the embodiment shown in FIG. 3B, the hard mask layer 28 is comprised of an insulator such as silicon dioxide, and has been etched to include a via through which electrical contact to a metal layer may be made.

Figure 4A:
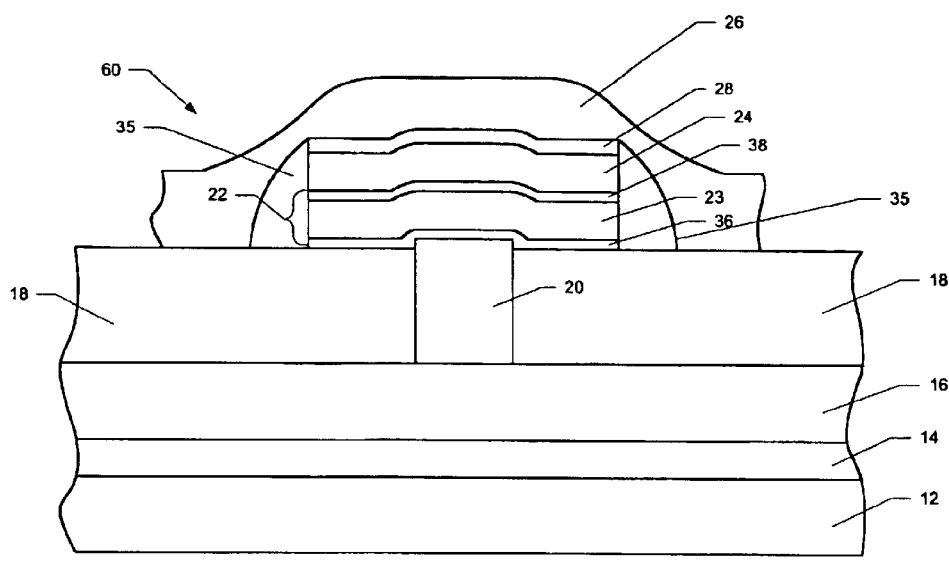
FIG. 4A is a cross-sectional view of another illustrative antifuse.

Referring now to FIG. 4A, a cross-sectional view shows an illustrative metal-to-metal antifuse 60. The embodiment illustrated in FIG. 4A is similar to the embodiment illustrated in FIG. 1A, and structures in the embodiment of FIG. 4A corresponding to structures in FIG. 1A will be identified by the same reference numerals. Also, unless otherwise noted, persons of ordinary skill in the art will appreciate that the materials and thicknesses of the various layers will be similar to those disclosed with respect to the embodiment of FIG. 1A.

A difference between the embodiments of FIGS. 1A and 4A is that an additional insulating layer or spacer 35, that may comprise a deposited layer of silicon nitride or silicon oxide (using PECVD techniques) having a thickness of about 50 nm to about 200 nm, with about 100 nm preferred, may be employed adjacent to the structure including antifuse layer 22 and barrier metal layer 24, as shown in FIG. 4A. This material protects antifuse layer 22 from shorting with the metal interconnect layer 26.

Figure 4B:
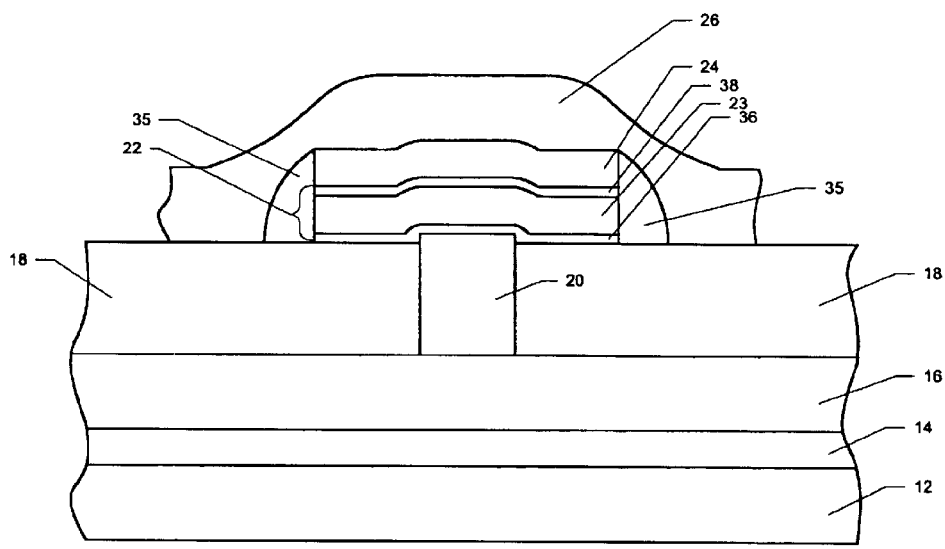
FIG. 4B is a cross-sectional view of another illustrative antifuse.

A difference between the embodiments shown in FIG. 4A and FIG. 4B is that FIG. 4B shows an embodiment where an insulating hard mask layer was used. The hard mask layer was removed prior to the disposing of metal interconnect layer 26 over the antifuse stack. Metal interconnect layer 26 is disposed over the spacer 35 and contacts barrier metal layer 24, as illustrated in FIG. 4B. FIG. 4A shows an embodiment with a conducting hard mask layer 28 (e.g., comprised of tungsten). In this embodiment, the hard mask 28 does not need to be removed.

Figure 5A:
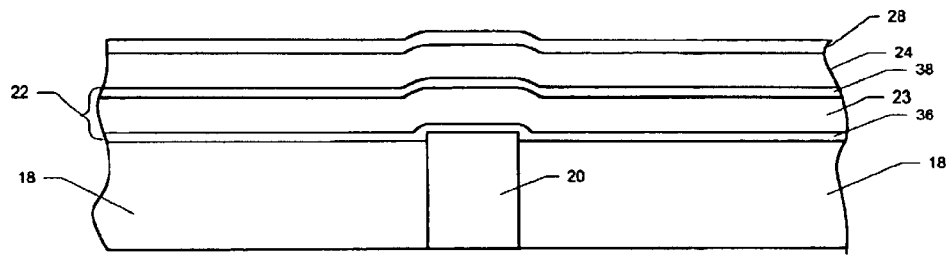
FIGS. 5A through 5C are cross-sectional views of the antifuse of FIG. 1A and FIG. 1B showing the structure existing at selected points in the fabrication process.
Figure 5B:
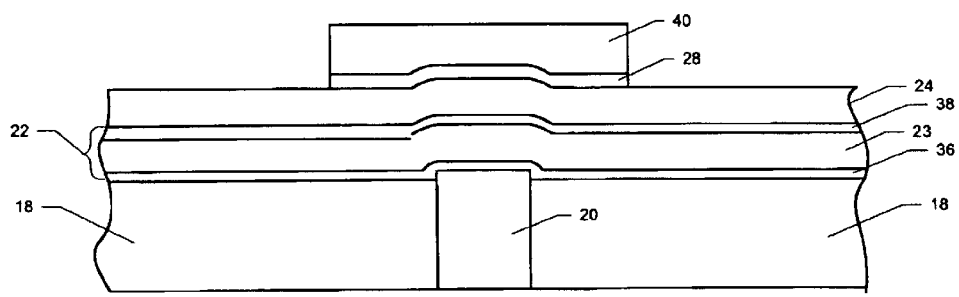
Figure 5C:
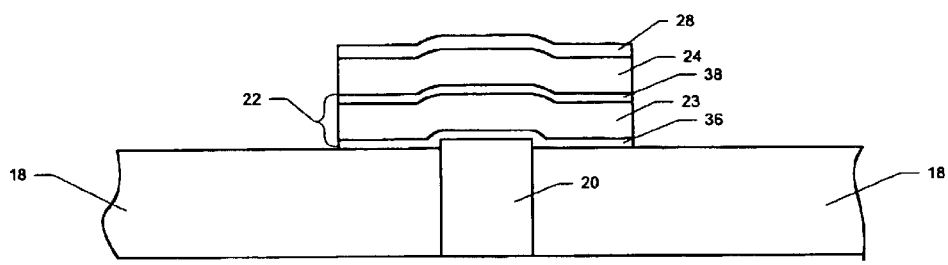

FIGS. 5A through 5C are cross-sectional views of the antifuse of FIG. 1A showing the structure existing at selected points in the fabrication process. Since the fabrication of antifuse 10 begins after the planarization of the insulating layer 18 and tungsten plug 20 that follows well-known prior processing steps, all of FIGS. 5A through 5C show the insulating layer 18 and tungsten plug 20 as the starting point for the fabrication process.

Referring first to FIG. 5A, antifuse 10 of FIG. 1A is fabricated by forming antifuse layer 22 over tungsten plug 20 and insulating layer 18. As previously noted, antifuse layer 22 may include thin adhesion-promoting material layers 36, 38, such as SiN or SiC deposited, for example, using PECVD techniques.

As will be appreciated by persons of ordinary skill in the art, the thickness of antifuse material 23 is usually from about 10 nm to about 80 nm. Such skilled persons will realize that the thickness used will depend on the desired programming voltage for the finished antifuse.

Next, barrier metal layer 24 is deposited to a thickness of about 25 nm to about 200 nm using PVD sputtering techniques. A hard mask layer 28 is deposited over the barrier metal layer 24. The hard mask layer 28 is deposited at about 500 angstroms to about 4,000 angstroms, with about 2,000 angstroms preferred.

Referring now to FIG. 5B, a layer of photoresist 40 is deposited on the hard mask layer 28 and then photoresist 40 and hard mask layer 28 are etched. Following etching, the photoresist 40 is stripped and the hard mask layer acts as an etch mask when etching the barrier metal layer 24 and the antifuse layer 22. Since Al, Ti, TiC, Ta, TaC, TaN, and TiN have high selectivity to tungsten (W), a thin layer of PVD or CVD tungsten (about 25 nm to about 50 nm) can be used as the hard mask 28. A tungsten hard mask layer 28 can be deposited at about 250 angstroms to about 4,000 angstroms, with about 500 angstroms preferred. Once the metal layer 24 is etched, the tungsten hard mask can be etched. It is also possible to leave the thin tungsten layer above the etched metal stack. The oxide or tungsten hard mask provides high etch selectivity and the possibility to etch metals without affecting the dielectric constant value (K) and mechanical properties of the amorphous carbon antifuse material 23.

As shown in FIG. 5B, after antifuse material 23, any necessary adhesion layers, and barrier metal layer 24 and hard mask 28 have been formed, a photoresist layer 40 is formed over the surface of hard mask layer 28 to define the shape of the antifuse "stack" comprising layers 36, 22, 38, 24, and 28. A conventional etching step is then performed to etch the hard mask 28 to the desired geometry. FIG. 5B depicts the structure remaining after the etching step used to define the shape of the hard mask but prior to removal of the photoresist layer 40.

A layer of photoresist is deposited on the hard mask layer 28 and then the hard mask layer 28 is etched. Following etching, the photoresist is stripped and the remaining hard mask layer is left as a hard mask, acting as an etch mask when etching the barrier metal layer 24 and the antifuse layer 22. The hard mask layer 28 protects the antifuse layer 22 from being removed during the photoresist stripping step. Since Al, Ti, Ta, TaN, and TiN have high selectivity to tungsten (W), a thin layer of PVD tungsten (about 25 nm to about 50 nm) can also be used as a hard mask 28 to etch the underlying metal 24. Since the tungsten layer is thin, only a thin layer of photoresist is required to pattern the hard mask. Once the hard mask is open, the remaining photoresist is stripped and metal layer 24 can be etched without organic material present on the metal stack. Once the metal layer 24 is etched, the tungsten hard mask can be etched in RIE with an SF6 chemistry. It is also possible to leave the thin tungsten layer above the etched metal stack. The oxide or tungsten hard mask provides high etch selectivity and the possibility to etch metals without affecting the dielectric constant value (K) and mechanical properties of the amorphous carbon antifuse layer 22.

Following removal of the photoresist 40, the device is etched using hard mask 28 to define the antifuse stack. Referring now to FIG. 5C, the antifuse stack following etching is shown. FIGS. 1A and 1B depict the antifuse structure of FIG. 5C after performance of further processing steps.

Figure 6A:
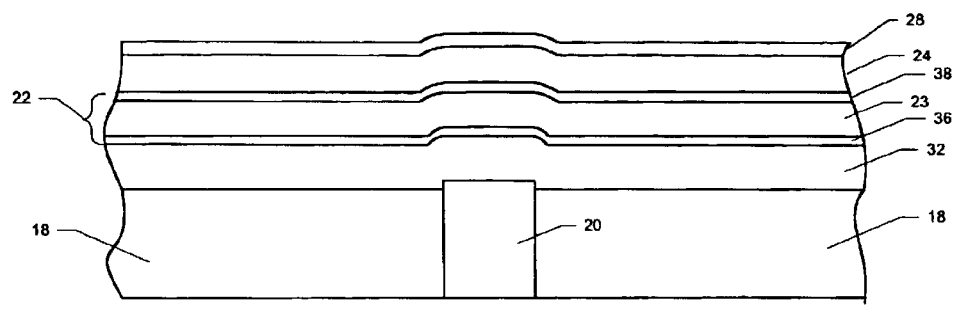
FIGS. 6A through 6C are cross-sectional views of the antifuse of FIG. 2A and FIG. 2B showing the structure existing at selected points in the fabrication process.
Figure 6B:
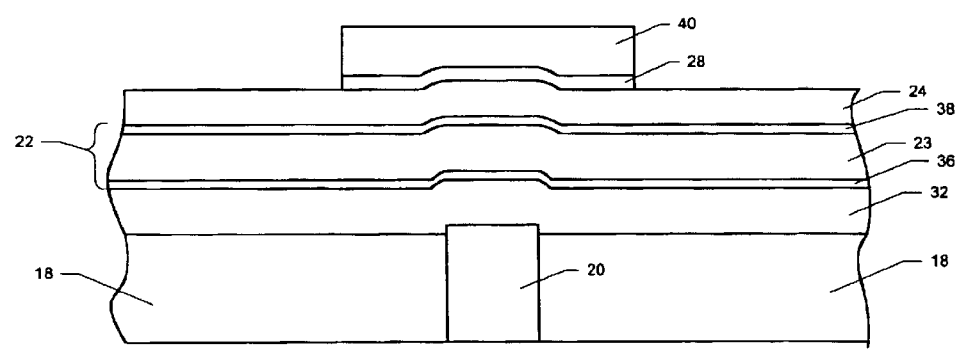
Figure 6C:
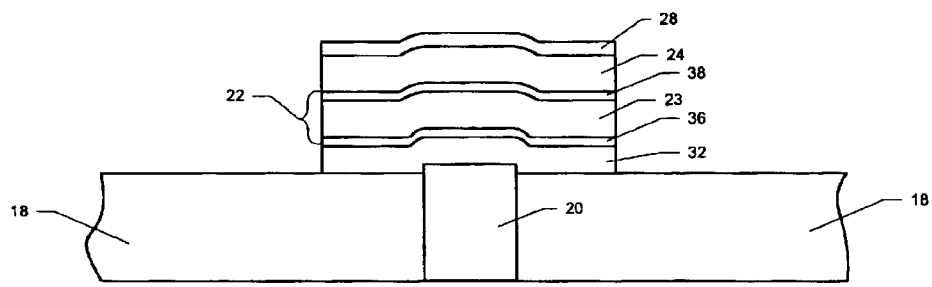

Referring now to FIGS. 6A through 6C, cross-sectional views show the structure of the antifuse 30 of FIGS. 2A and 2B existing at selected points in the fabrication process. The results of the processing steps are analogous to those shown in FIGS. 5A–5C, but for a device such as shown in FIG. 2A and 2B. Referring to FIG. 6A, antifuse 30 of FIGS. 1A and 1B is fabricated by depositing barrier metal layer 32 over tungsten plug 20 and insulating layer 18. FIGS. 2A and 2B depict the structure of antifuse 30 in FIG. 6C after performance of additional processing steps.

Figure 7A:
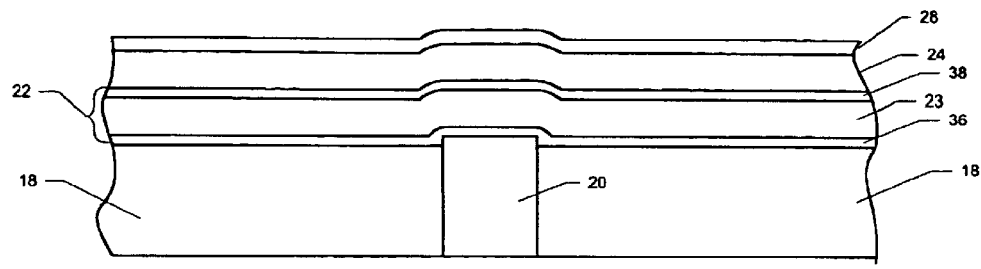
FIGS. 7A through 7C are cross-sectional views of the antifuse of FIG. 3A and FIG. 3B showing the structure existing at selected points in the fabrication process.
Figure 7B:
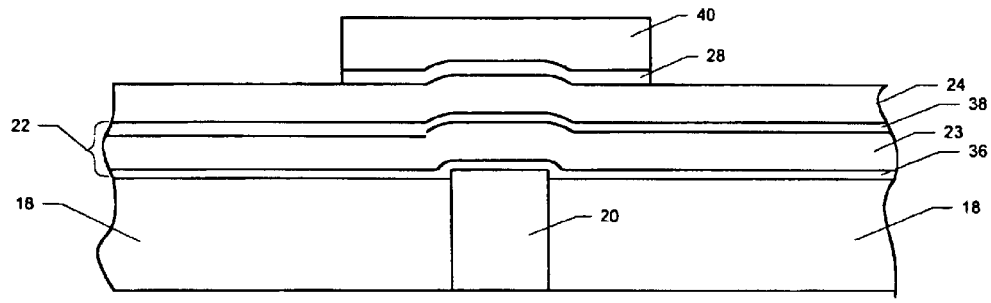
Figure 7C:
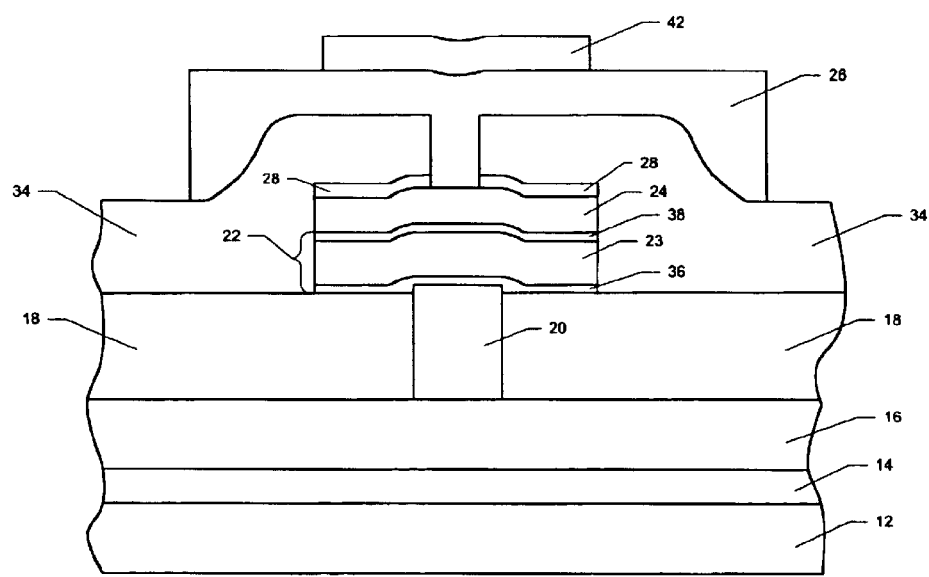

Referring now to FIGS. 7A through 7C, cross-sectional views show the structure of the antifuse 50 of FIGS. 3A and 3B existing at selected points in the fabrication process. The results of the processing steps are analogous to those shown in FIGS. 5A–5C, but for a device such as shown in FIG. 3A and 3B.

Referring now specifically to FIG. 7C, photoresist 40 has been removed using conventional mask-stripping steps and layers 24 through 36 have been etched and an insulating layer 34 has been deposited over the layers 36, 22, 38, and 24 comprising the antifuse stack and the exposed surface of the insulating layer 18. Conventional masking and etching techniques (not shown) are then employed to form a contact via in insulating layer 34 and in hard mask 28 (in the case of an oxide hard mask). Next, metal interconnect layer 26 is deposited over insulating layer 34 and in the contact via where it is electrically connected to barrier metal layer 24. A masking layer 42 may be formed over metal interconnect layer 26 using conventional photolithographic techniques in preparation for a metal-etch step to define the geometry of metal interconnect layer 26. FIG. 3B depicts the structure of antifuse 50 in FIG. 7C after performance of further processing steps.

Figure 8A:
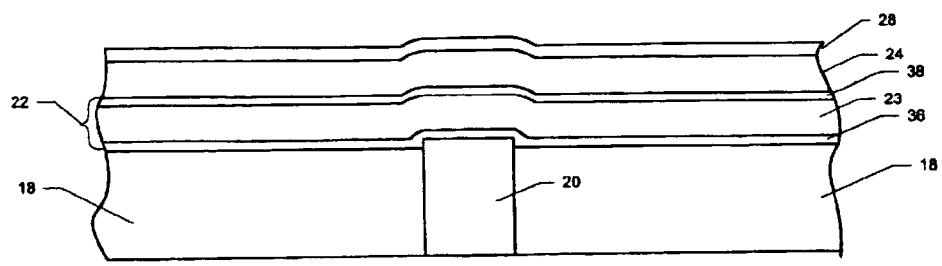
FIGS. 8A through 8C are cross-sectional views of the antifuse of FIG. 4A and FIG. 4B showing the structure existing at selected points in the fabrication process.
Figure 8B:
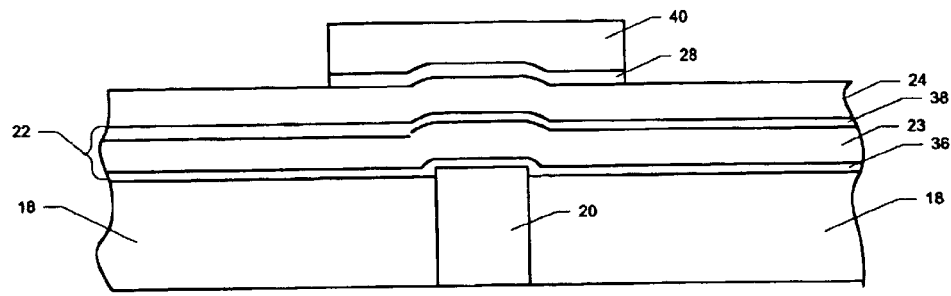
Figure 8C:
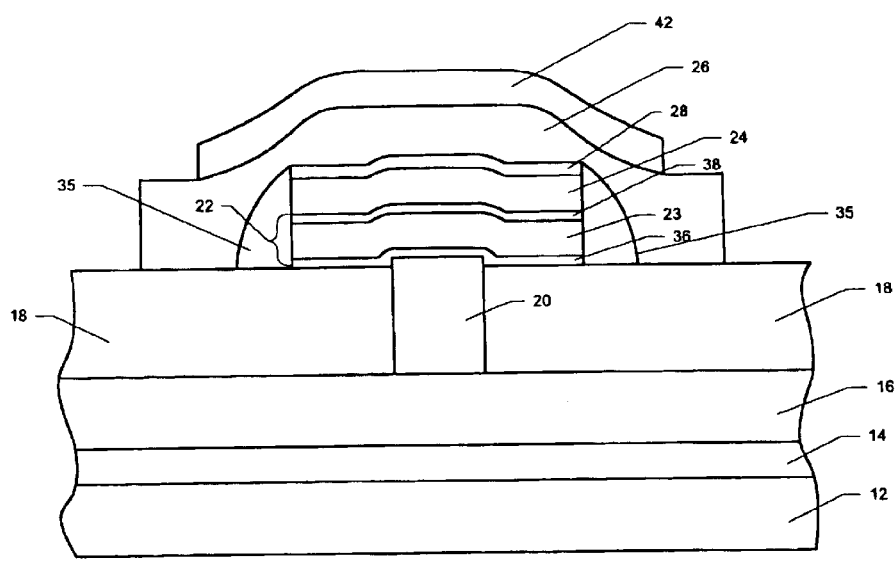

Referring now to FIGS. 8A through 8C, cross-sectional views show the structure of the antifuse 60 of FIGS. 4A and 4B existing at selected points in the fabrication process. The results of the processing steps are analogous to those shown in FIGS. 5A–5C, but for a device such as shown in FIG. 4A and 4B.

Referring now specifically to FIG. 8C, photoresist 40 has been removed using conventional mask-stripping steps and layers 24 through 36 have been etched and an insulating layer 35 is deposited over the layers 36, 22, 38, and 24 comprising the antifuse stack and the exposed surface of the insulating layer 18. Conventional masking and etching techniques (not shown) are then employed to form insulating layer 35 into spacers, shown in FIG. 8C. Next, metal interconnect layer 26 is deposited over spacers 35 and is electrically connected to barrier metal layer 24. A masking layer 42 may be formed over metal interconnect layer 26 using conventional photolithographic techniques in preparation for final processing. FIG. 4A depicts the structure of antifuse 60 in FIG. 8C after performance of further processing steps.

The use of amorphous carbon, amorphous carbon doped with at least one of hydrogen and fluorine, or amorphous silicon carbide, as the antifuse material layer in metal-to-metal antifuses inhibits the "healing" or "switching" by which the conductive filament deteriorates after programming.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of fabricating a metal-to-metal antifuse, comprising:

planarizing an insulating layer and a tungsten plug;

forming an antifuse layer over said insulating layer and said tungsten plug, wherein said antifuse layer comprises a lower adhesion-promoting layer, an upper adhesion promoting layer, and a middle layer comprising a material selected from a group consisting of at least one of amorphous carbon and amorphous carbon doped with at least one of hydrogen and fluorine;

forming a barrier metal layer over said antifuse layer;

forming at least one of an oxide layer and a tungsten layer over said barrier metal layer;

forming a layer of photoresist over at least one of said oxide layer and said tungsten layer;

defining at least one of said oxide layer and said tungsten layer;

removing said photoresist; and defining said antifuse layer and said barrier metal layer.

2. The method of claim 1, wherein said forming said antifuse layer comprises forming said antifuse layer to a thickness of about 2.5 nm to about 80 nm.

3. The method of claim 1, wherein said forming said barrier metal layer comprises forming said barrier metal layer to a thickness of about 25 nm to about 200 nm.

4. The method of claim 1, wherein said forming said barrier metal layer comprises forming said barrier metal layer from a material selected from the group consisting of Ta, TaC, TaN, Ti, TiC, and TiN.

5. The method of claim 1, further comprising:

forming a second insulating layer in physical contact with said barrier metal layer, said antifuse layer, said insulating layer, and said metal interconnect layer; and defining said second insulating layer.

6. The method of claim 1, further comprising:

forming a layer of a third insulating material over said barrier metal layer and said antifuse layer; and defining said third insulating material into spacers disposed in physical contact with said antifuse layer and said barrier metal layer.

7. The method of claim 1, wherein said upper adhesion promoting layer is selected from at least one of a group consisting of amorphous silicon carbide and and amorphous silicon nitride.

8. The method of claim 1, wherein said lower adhesion promoting layer is selected from at least one of a group consisting of amorphous silicon nitride and amorphous silicon carbide.

9. The method of claim 1, wherein said forming an antifuse layer is deposited from an acetylene source gas.

10. The method of claim 5, further comprising:
forming a via in said second insulating layer and said tungsten layer.

11. A method of fabricating a metal-to-metal antifuse, comprising:
planarizing an insulating layer and a tungsten plug;
forming a first barrier metal layer over said insulating layer and said tungsten plug;
forming an antifuse layer over said first barrier metal layer, wherein said antifuse layer comprises a lower adhesion-promoting layer, an upper adhesion promoting layer, and a middle layer comprising a material selected from a group consisting of at least one of amorphous carbon and amorphous carbon doped with at least one of hydrogen and fluorine, and amorphous silicon carbide;
forming a second barrier metal layer over said antifuse layer;
forming at least one of an oxide layer and a tungsten layer over said second barrier metal layer;
forming a layer of photoresist over at least one of said oxide layer and said tungsten layer;
defining at least one of said oxide layer and said tungsten layer;
removing said photoresist; and
defining said first barrier metal layer, said antifuse layer, and said second barrier metal layer.

12. The method of claim 11, further comprising:
formning a contact via in said second insulating layer;
forming a metal interconnect layer over said second insulating layer and in said contact via; and
etching said metal interconnect layer.

13. The method of claim 11, further comprising:
forming a contact via in said second insulating layer and said oxide layer;
forming a metal interconnect layer over said second insulating layer and in said contact via such that said metal interconnect layer is in electrical communication with said barrier metal layer; and
etching said metal interconnect layer.

14. A method of fabricating a metal-to-metal antifuse, comprising:
planarizing a first insulating layer and a tungsten plug;
forming an antifuse layer over said first insulating layer and said tungsten plug, wherein said antifuse layer comprises a lower adhesion-promoting layer, an upper adhesion promoting layer, and a middle layer comprising a material selected from a group consisting of at least one of amorphous carbon and amorphous carbon doped with at least one of hydrogen and fluorine;

forming a barrier metal layer over said antifuse layer;
forming at least one of an oxide layer and a tungsten layer over said barrier metal layer;
forming a layer of photoresist over at least one of said oxide layer and said tungsten layer;
defining at least one of said oxide layer and said tungsten layer;
removing said photoresist;
defining said antifuse layer and said barrier metal layer; and
forming a second insulating layer over said antifuse layer and said barrier metal layer.

15. The method of claim 14, further comprising:
forming a contact via in said second insulating layer;
forming a metal interconnect layer over said second insulating layer and in said contact via;
forming a masking layer over said metal interconnect layer; and
etching said metal interconnect layer.

16. The method of claim 14, further comprising:
forming a contact via in said second insulating layer and said oxide layer;
forming a metal interconnect layer over said second insulating layer and in said contact via such that said metal interconnect layer is in electrical communication with said barrier metal layer;
forming a masking layer over said metal interconnect layer; and
etching said metal interconnect layer.

17. A method of fabricating a metal-to-metal antifuse, comprising:
planarizing a first insulating layer and a tungsten plug;
forming an antifuse layer over said first insulating layer and said tungsten plug, wherein said antifuse layer comprises a lower adhesion-promoting layer, an upper adhesion promoting layer, and a middle layer comprising a material selected from a group consisting of at least one of amorphous carbon and amorphous carbon doped with at least one of hydrogen and fluorine;
forming a barrier metal layer over said antifuse layer;
forming at least one of an oxide layer and a tungsten layer over said barrier metal layer;
forming a layer of photoresist over at least one of said oxide layer and said tungsten layer;
defining at least one of said oxide layer and said tungsten layer;
removing said photoresist;
defining said antifuse layer and said barrier metal layer;
forming a second insulating layer over said antifuse layer, said barrier metal layer, and said first insulating layer;
forming said second insulating layer into spacers;
forming a metal interconnect layer over said spacers such that said metal interconnect layer is in electrical communication with said barrier metal layer;
forming a masking layer over said metal interconnect layer; and
etching said metal interconnect layer.

* * * * *